(12) United States Patent
Dong et al.

(10) Patent No.: US 8,289,195 B1
(45) Date of Patent: Oct. 16, 2012

(54) FRACTIONAL RATE RESAMPLING FILTER ON FPGA

(75) Inventors: Xiaofei Dong, Sunnyvale, CA (US); Hong Shan Neoh, Princeton, NJ (US)

(73) Assignee: Altera Corporation, San Jose, CA (US)

( * ) Notice: Subject to any disclaimer, the term of this patent is extended or adjusted under 35 U.S.C. 154(b) by 90 days.

(21) Appl. No.: 13/072,592

(22) Filed: Mar. 25, 2011

(51) Int. Cl.
*H03M 7/00* (2006.01)

(52) U.S. Cl. .......... 341/61; 375/350; 375/229; 375/377; 375/346; 375/285; 716/100; 716/106; 327/156; 327/291; 327/294; 327/337; 702/66; 702/76; 708/313

(58) Field of Classification Search .............. 341/50–90; 375/350, 229, 377, 346, 285, 240.1, 240.29; 702/66, 76; 716/100, 106; 708/313; 327/156, 327/291, 294, 337; 331/45, 46; 342/118
See application file for complete search history.

(56) References Cited

U.S. PATENT DOCUMENTS

| | | | | |
|---|---|---|---|---|
| 5,173,948 A | * | 12/1992 | Blackham et al. | 382/293 |
| 6,531,969 B2 | * | 3/2003 | Chu | 341/61 |
| 7,078,946 B2 | * | 7/2006 | van der Valk et al. | 327/156 |
| 7,471,843 B2 | * | 12/2008 | Messing et al. | 382/260 |
| 7,511,656 B2 | * | 3/2009 | Callison | 342/118 |
| 7,529,139 B2 | * | 5/2009 | Huang et al. | 365/189.02 |
| 7,598,790 B1 | * | 10/2009 | Esposito et al. | 327/294 |
| 7,949,699 B1 | * | 5/2011 | Neoh et al. | 708/313 |
| 8,108,166 B2 | * | 1/2012 | Arnold et al. | 702/76 |
| 8,156,452 B1 | * | 4/2012 | Neoh | 716/100 |
| 8,180,002 B2 | * | 5/2012 | Kino et al. | 375/346 |
| 8,189,656 B2 | * | 5/2012 | Ma et al. | 375/240.01 |

OTHER PUBLICATIONS

P. P. Vaidyanathan, "Multirate Systems and Filter Banks," Prentice Hall, Englewood Cliffs, 1993, Chapter 4, pp. 100-187 and Index, pp. 891-911.

* cited by examiner

*Primary Examiner* — Lam T Mai (74) *Attorney, Agent, or Firm* — Ropes & Gray LLP (57) ABSTRACT

A programmable logic device can be configured as a fractional rate resampling filter capable of performing downsampling prior to upsampling without modifying the overall filter response. Input data may be received at a first sample rate and may be downsampled to generate downsampled data. Portions of the downsampled data may be respectively output to different filtering paths. Each filtering path may include a cluster of filter components that corresponds to different sub-filters of the overall filter response and may be operable to receive and process the different portions of the downsampled data. Outputs of each cluster may be combined to generate output data at a second sample rate. The resampling filter structure can reduce the number of multiplier circuits used by allowing time-division multiplexing among different filter components.

24 Claims, 7 Drawing Sheets

FRACTIONAL RATE RESAMPLING FILTER ON FPGA

FIELD OF THE INVENTION

This invention relates to digital signal processing ("DSP") circuitry, especially on field-programmable gate array ("FPGA") devices. More particularly, the invention relates to such DSP circuitry that is adapted to implement resampling filters.

BACKGROUND OF THE INVENTION

A resampling filter, or a sample rate converter, converts an input sample rate to a different output sample rate. It is a widely used filter structure that appears in a variety of applications including general signal processing, medical imaging, wireless communications, and military applications. One particularly useful type of resampling filter is a fractional rate resampling filter. In this type of resampling filter, the output sample rate is a well-defined fraction, U/D, of the input sample rate, where U and D are integers, typically co-prime.

A common implementation of a resampling filter uses decimation or interpolation, or a combination of both. Decimation (or equivalently downsampling) decreases the number of samples of an input signal by a factor of D by removing D minus 1 out of every D samples. Decimation may therefore result in aliasing unless the input signal is band limited in such a way that it is possible to recover the input signal from the downsampled signal without loss of information. Conversely, interpolation (or equivalently upsampling) increases the number of samples of an input signal by a factor of U by inserting ("interpolating") U minus 1 samples between adjacent samples.

In conventional fractional rate resampling filters, interpolation is generally performed before decimation to preserve the properties of the input signal spectrum and to protect the input signal from aliasing. For example, a conventional U/D fractional rate resampling filter first upsamples the input signal by an upsampling or interpolation factor, U, and second, downsamples the upsampled signal by a downsampling or decimation factor, D. Conventional fractional rate resampling filters thus need to first raise the input signal sample rate before processing and/or downsampling. However, if the input signal sample rate is too high, such implementations of the conventional form of a fractional rate resampling filter may not be feasible. For instance, an FPGA may receive input data from a high speed Analog to Digital Converter at a rate of 500 MHz. If a 2/5 fractional rate conversion is desired (i.e., U=2 and D=5) and upsampling by a factor of U=2 is performed first, the FPGA will need to process signals at a rate of 1 GHz. Such high rates may not be feasible on some devices. Furthermore, even for moderate input sample rates, a large interpolation factor U may raise the sample rate higher than is feasible on some devices.

An alternative to the interpolation and decimation cascade described above is a Farrow filter. A Farrow filter uses polynomial approximation to replace a conventional resampling filter, such that the approximation is done section by section. Commonly used Farrow filters interpolate neighboring sample points via cubic or parabolic interpolation. However, if the application has a strict requirement on the filter response, approximations, and therefore a Farrow filter, cannot be used. Furthermore, if the input sample rate exceeds the device clock rate, a Farrow filter cannot be used either.

SUMMARY OF THE INVENTION

The present invention relates to circuitry and methods for effectively implementing a fractional rate resampling filter. In particular, a programmable logic device can be configured as a fractional rate resampling filter capable of performing downsampling prior to upsampling without modifying the overall filter response.

In some embodiments, a method and circuit are provided for resampling data from a first input sample rate to a second output sample rate. Received input data may be downsampled to generate downsampled data at a rate lower than the input sample rate. A first portion of the downsampled data may be output to a first filtering path and a second portion of the downsampled data may be output to a second filtering path. Each filtering path may include a cluster of filter components such that a first portion of the cluster is operable to receive and process, during a first cycle, one of the portions of the downsampled data and a second portion of each cluster is operable to receive and process, during a second cycle, the portion of the downsampled data received by the first portion of the cluster. Outputs of each cluster of the first and second filtering paths may be combined to generate output data at a second sample rate. In some implementations, the first portion of each cluster of the first and second filtering paths may respectively process a first subband of the portions of the downsampled data, while the second portion of each cluster of the first and second filtering paths may respectively process a second subband of the portions of the downsampled data. In some implementations, outputs of each cluster of the first and second filtering paths may be combined by upsampling the outputs of each cluster of the first and second filtering paths following the downsampling. In some implementations, outputs of each cluster of the first and second filtering paths may be combined by summing outputs of the first portion of each cluster of the first and second filtering paths to generate a first output, and summing outputs of the second portion of each cluster of the first and second filtering paths to generate a second output. A final output may then be generated by selectively outputting, using selection circuitry, one of the first and second outputs at the second sample rate.

In some embodiments, the first and second portions of each cluster may be operable to share resources such that the first portion of each cluster uses the resources during the first cycle and the second portion of each cluster uses the resources during the second cycle. In some implementations, these shared resources may include multiplier circuits and a selection circuitry associated with each multiplier circuit. In some implementations, the selection circuitry may operate to selectively output to each multiplier circuit one of a first and second filtering coefficients associated respectively with one of the first and second portions of each cluster. The first filtering coefficient may be selected during the first cycle and the second filtering coefficient may be selected during the second cycle. In some implementations, one of the first and second portion of downsampled data may be delayed and output into one of the multiplier circuits for multiplying with one of the first and second filtering coefficients. In some implementations, outputs of each cluster of the first and second filtering paths may be combined by summing outputs of the multiplier circuits. In some implementations, the downsampling may be performed using a low-voltage differential signaling (LVDS) receiver implemented on a field-programmable gate array (FPGA).

BRIEF DESCRIPTION OF THE DRAWINGS

Further features of the invention, its nature and various advantages will be apparent upon consideration of the following detailed description, taken in conjunction with the accompanying drawings, in which like reference characters refer to like parts throughout, and in which.

DETAILED DESCRIPTION OF THE INVENTION

Figure 1:
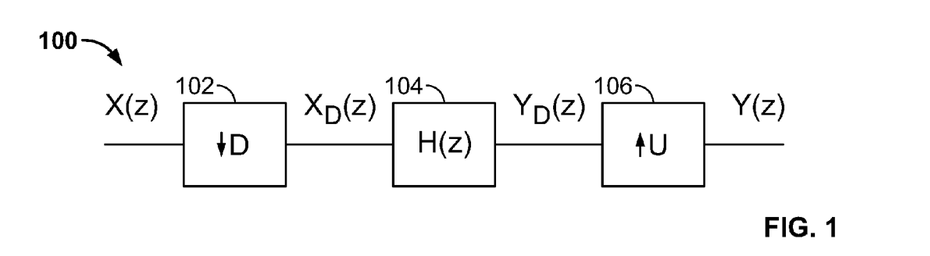
FIG. 1 is a simplified block diagram of a resampling filter incorporating the embodiments of the present invention.

A simplified block diagram of an integrated circuit ("IC" or "device") 100 in accordance with embodiments of the present invention is shown in FIG. 1. Integrated circuitry 100 can include a programmable logic device ("PLD"), a field-programmable gate array ("FPGA"), other programmable devices, or any combination thereof. Input signal X(z) has input sample rate $f_s$ and is first downsampled by a downsampling factor, D, using downsampler block 102. Downsampler block 102 outputs downsampled data $X_D(z)$ at a rate of $f_s/D$. Downsampled data $X_D(z)$ is then processed using filter block 104 corresponding to filter response function H(z) to generate processed data $Y_D(z)$. Processed data $Y_D(z)$ is subsequently upsampled by an upsampling factor, U, using upsampler block 106 to generate output signal Y(z). Output signal Y(z) thus has sample rate $(U/D)f_s$. Typically, U and D are co-prime integers, i.e., integers greater than 1 with no positive common factor other than 1.

Unlike conventional resampling filters that implement upsampling prior to downsampling, circuitry 100 of FIG. 1 manipulates the conventional resampling filter structure such that downsampling is performed prior to upsampling. This reduction in sample rate upfront allows high speed input signals and/or high upsampling factors to be supported. Consequently, data can be processed at low sample rates that are, e.g., feasible on an FPGA.

As will be illustrated in connection with FIGS. 2A-2C below, the manipulation shown in FIG. 1 is not a blindfold inversion of the order of interpolation and decimation, which would cause signal distortion and information loss. Rather the filter response in the filter structure of FIG. 1 is kept intact. The computations required to process signals, such as multiplication and addition, can therefore be carried out at a much lower sampling rate compared with that of the input signal. As will be discussed below, this allows reusing hardware resources such as memory, multipliers, and adders in a time division multiplexed (TDM) fashion.

The following description of exemplary embodiments of the present disclosure provides illustration and description for the case of a 2/5 fractional rate resampling filter with an upsampling factor U=2 and a downsampling factor D=5. This is not intended to be exhaustive or to limit the disclosure to the precise form disclosed. Modifications and generalizations to an arbitrary resampling rate are possible in light of the present teachings or may be acquired from practice of what is disclosed herein, and will be further discussed below.

The structure shown in FIG. 1 can be obtained through a sequence of manipulations of a conventional resampling filter. As discussed above, a conventional U/D resampling filter is typically implemented by first downsampling input signal X(z) by D, filtering by an overall prototype filter response function H(z), and finally upsampling by U. This direct form implementation corresponding to performing downsampling prior to upsampling protects the input signal from aliasing and spectrum distortion. FIGS. 2A-2C illustrate an exemplary sequence of steps for manipulating this direct form of a resampling filter to arrive at the filter structure illustrated in FIG. 1.

The prototype filter response function H(z) can further be decomposed by U to yield U filtering paths. This is shown in FIG. 2A that represents a step in manipulating the order of downsampling and upsampling according to one embodiment of the present invention. Polyphase decomposition is applied to the prototype filter function H(z) to generate multiple subfilter components. Polyphase decomposition breaks down data and filter into subcomponents, each corresponding to a sub-band of the original signal or filter.

Figure 2A:
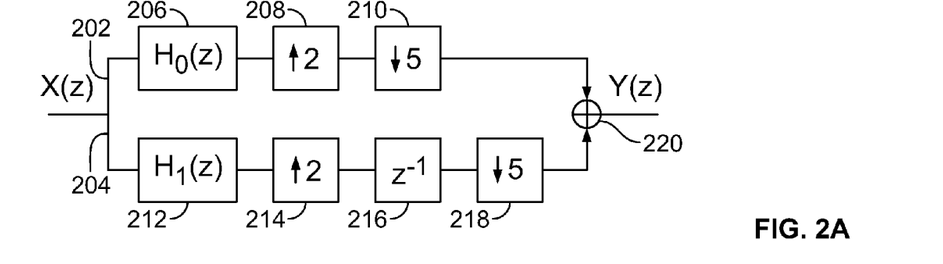
FIGS. 2A-2C are representations of operations used to invert the order of interpolation and decimation in a resampling filter incorporating the embodiments of the present invention.

In the example of FIG. 2A, the prototype filter response H(z) is polyphase-decomposed into U=2 components $H_0(z)$ and $H_1(z)$ as follows:

$$H(z)=H_0(z^2)+H_1(z^2)z^{-1}, \quad \text{(EQ. 1)}$$

where $H_0(z)$ corresponds to a first polyphase component or subfilter of H(z), and $H_1(z)$ corresponds to a second polyphase or subfilter of H(z). For example, $H_0(z)$ may represent the even-numbered coefficients of the prototype filter response H(z) while $H_1(z)$ may represent the odd-numbered coefficients of the prototype filter response H(z). Polyphase decomposition thus offers one way to decompose the filtering response into two separate filtering paths 202 and 204 corresponding, respectively, to subfilters $H_0(z)$ and $H_1(z)$. Input signal X(z), having an input sampling rate $f_s$, may thus be filtered independently along the two filtering paths through subfilters 206 corresponding to $H_0(z)$ and 212 corresponding to $H_1(z)$. In the top filtering path 202, upsampler block 208 upsamples the output of subfilter 206 (i.e., of subfilter $H_0(z)$), and downsampler block 210 downsamples the upsampled data by 5. In the bottom filtering path 204, upsampler block 214 upsamples the output of subfilter 212 (i.e., of subfilter $H_1(z)$), delay block 216 introduces a delay of a single time cycle according to the polyphase decomposition of EQ. 1, then downsampler block 218 downsamples the upsampled data by 5. Finally, adder circuitry 220 combines the outputs of filtering paths 202 and 204 to generate output signal Y(z). This structure is equivalent to a filter that first upsamples by 2, processes the upsampled signal using prototype filter response function H(z), and finally downsamples by 5.

Recognizing that a single cycle delay element $z^{-1}$ can be expressed as a combination of advance and delay elements, delay element 216 can be decomposed into elements whose exponents are multiples of U or D. In some implementations, a factorization is selected into advance and delay elements, such that a first exponent is the smallest integer multiple of the upsampling factor U, and a second exponent is the smallest integer multiple of the downsampling factor D. In this particular example, a delay by 1 can be represented by an advance of 4 followed by a delay of 5, i.e., $z^{-1}=(z^2)^2(z^{-1})^5$. Through this decomposition, the filtering blocks may be rearranged by applying the Noble Identity for commuting downsamplers and/or upsamplers with filter response function blocks, as illustrated in FIG. 2B.

According to the Noble Identity, the delay component whose exponent is a multiple of U may be moved to the left of an upsampler by U, and the delay component whose exponent is a multiple of D may be moved to the right of the downsampler by D. Thus, the $z^{-1}$ delay element 216 of FIG. 2A may be replaced by a $z^2$ delay element 232 to the left of the upsampler block 234, and a $z^{-1}$ delay element 238 to the right of the downsampler block 236.

Figure 2B:
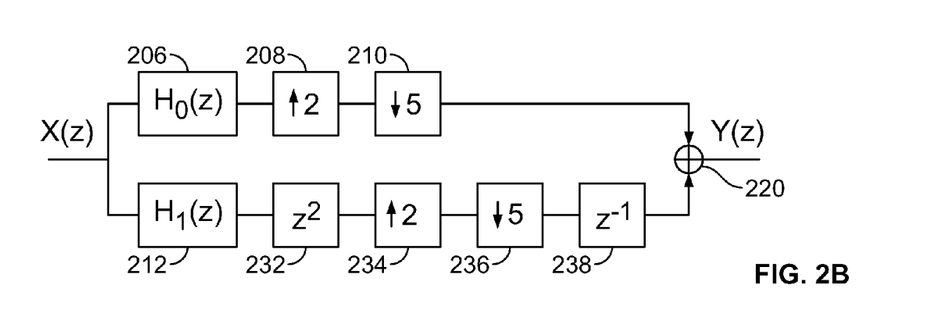

At the end of performing these operations, the upsampler and downsampler blocks of FIG. 2B are cascaded without any processing in between. The order of these blocks may be swapped as illustrated in FIG. 2C, where downsampler block 268 is placed before upsampler block 270, and downsampler block 274 is placed before upsampler block 276. This manipulation can be applied since U and D are co-prime and both greater than 1, which is commonly the case in fractional rate resampling filters.

Figure 2C:
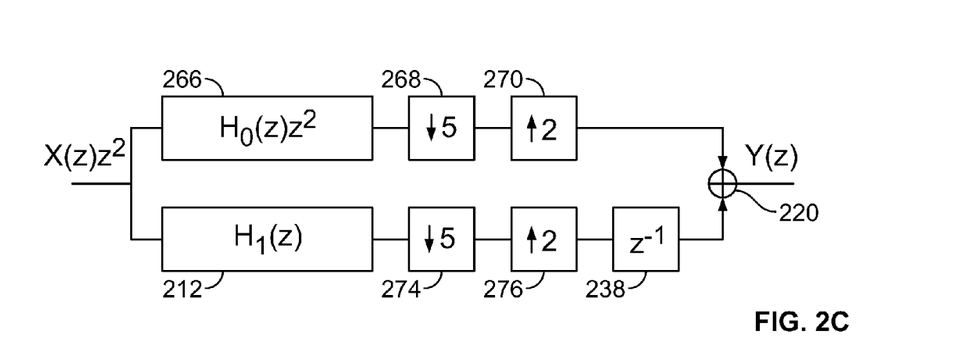

In addition, the $z^2$ delay element 232 of FIG. 2B is eliminated from FIG. 2C to ensure that the overall system is causal. This is done by introducing a two-cycle delay to the input data X(z), and the filter response function of block 266. Such manipulations of the delay and advance elements can thus be incorporated into the subfilter components, and do not change the signal property.

The filtering systems in FIGS. 2A-2C all generate the same output signal Y(z) corresponding to the input signal X(z) filtered by prototype filter response function H(z), and having rate $(2/5)f_s$. However, the manipulations illustrated in these figures allow the order of upsampling and downsampling to be interchanged as shown in FIG. 2C.

Figure 3:
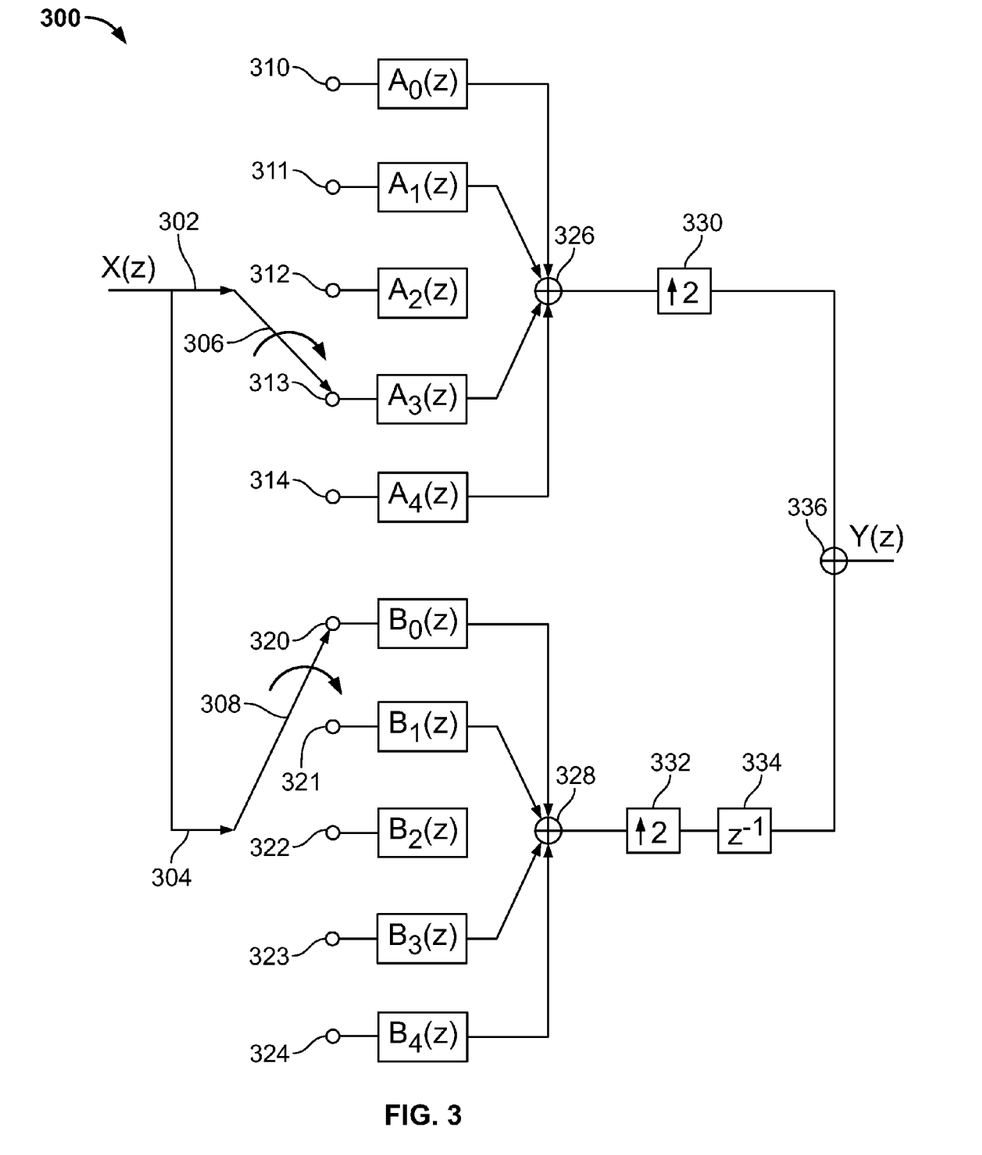
FIG. 3 is a block diagram of a first embodiment of a resampling filter in accordance with one embodiment of the present invention.

FIG. 3 is a block diagram of a resampling filter 300 adapted to perform downsampling prior to upsampling in accordance with an embodiment of the present invention. FIG. 3 may be obtained by further manipulating the filter of FIG. 2C. For example, one can apply polyphase decomposition by D=5 to subfilter $H_0(z)$ from FIG. 2C to generate a first bank of filter components $A_0(z)$ through $A_4(z)$. Similarly, one can apply polyphase decomposition by D=5 to subfilter $H_1(z)$ from FIG. 2C to generate a second bank of filter components $B_0(z)$ through $B_4(z)$. Filter 300 includes commutator circuitries 306 and 308, filter components $A_0(z)$, $A_1(z)$, $A_2(z)$, $A_3(z)$, and $A_4(z)$, and $B_0(z)$, $B_1(z)$, $B_2(z)$, $B_3(z)$, and $B_4(z)$, adder circuitries 326 and 328, upsampler blocks 330, 332, delay element block 334, and adder circuitry 336. Adder circuitry 336 may be implemented using summing circuitry and/or subtracting circuitry, look-up tables, or any other suitable implementation.

As shown in FIG. 3, a common input signal X(z) is fed into both filtering paths 302 and 304 through commutator circuitries 306 and 308, respectively. The input signal is clocked in at a rate of one sample per unit time, corresponding to a sample rate of $f_s$. Each filtering path is further subdivided into D filtering paths corresponding, respectively, to a filter component. In particular, filtering path 302 is decomposed into D filtering paths 310, 311, 312, 313, and 314, corresponding to filter components $A_0(z)$, $A_1(z)$, $A_2(z)$, $A_3(z)$, and $A_4(z)$, respectively. Similarly, filtering path 302 is decomposed into D filtering paths 320, 321, 322, 323, and 324, corresponding to filter components $B_0(z)$, $B_1(z)$, $B_2(z)$, $B_3(z)$, and $B_4(z)$, respectively.

Commutator circuitry 306 cycles through filtering paths 310 through 314, delivering one input sample to a path at each time unit, e.g., every clock cycle. It thus takes D=5 cycles for the next valid sample to appear on each filtering path. Accordingly, the sample rate on each path 310 through 314 is $f_s/D$, and that commutator circuitry 306 thus performs downsampling by a factor of D. The same applies to commutator circuitry 308 and filtering paths 320 through 324.

Because of the two-cycle advance introduced in FIG. 2C to ensure causality of the filter, commutator circuitry 306 may be configured to start from the second to last filtering path, or path 313 corresponding to filter component $A_3(z)$. The advance on the input signal can thus be ignored by adjusting the starting point of the commutator, e.g., starting from the second to last polyphase of the top filter to account for the $z^{-2}$ delay.

Adder circuitry 326 combines the outputs of each filter component $A_0(z)$ through $A_4(z)$. Upsampler block 330 upsamples the output of adder circuitry 326 to generate output data at $(U/D)f_s$. Similarly adder circuitry 328 combines the outputs of each filter component $B_0(z)$ through $B_4(z)$. Upsampler block 328 upsamples the combined result to generate output data at $(U/D)f_s$. Delay element 334 introduces a single delay element in accordance with the polyphase decomposition of EQ. 1. Finally, adder circuitry 336 outputs the final filtered output data, Y(z), at a rate of $(U/D)f_s$.

Figure 4:
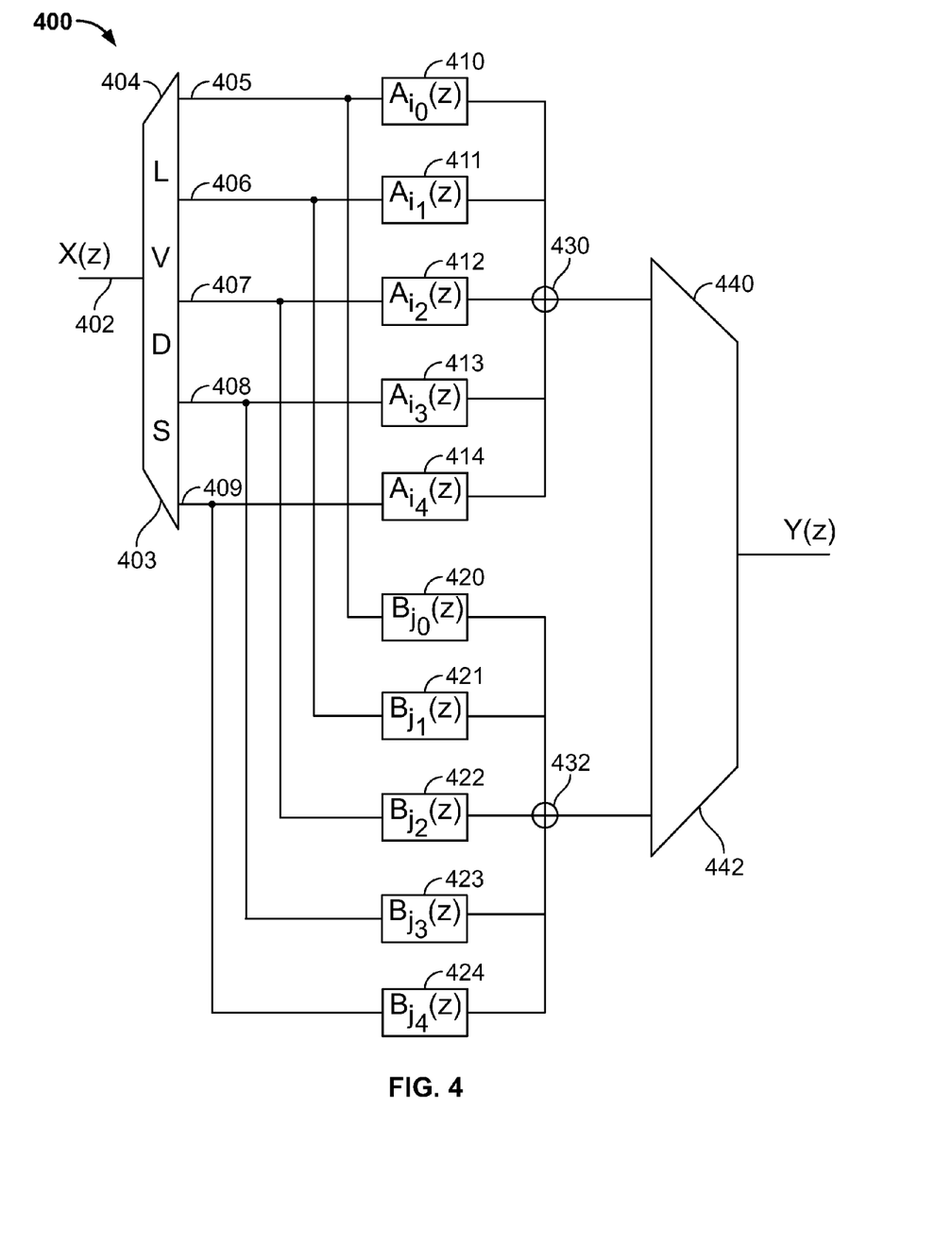
FIG. 4 is a block diagram of a second embodiment of a resampling filter in accordance with one embodiment of the present invention.

Filter 300 of FIG. 3 can further be simplified as illustrated in FIG. 4, which shows filter 400. Filter 400 includes a low-voltage differential signaling (LVDS) receiver 404, filter components 410-414 corresponding, respectively, to $A_{i_0}(z)$ through $A_{i_4}(z)$, and filter components 420-424 corresponding, respectively, to $B_{j_0}(z)$ through $B_{j_4}(z)$. Filter components $A_{i_0}(z)$ through $A_{i_4}(z)$ may correspond to a D-fold polyphase decomposition of a first subfilter $H_0(z)$ of prototype response filter H(z), whereas filter components $B_{j_0}(z)$ through $B_{j_4}(z)$ may correspond to a D-fold polyphase decomposition of a second subfilter $H_1(z)$ of H(z). Filter 400 also includes two adder circuitries 430 and 432, and multiplexer 442. Adder circuitry 430 and 432 can be implemented using the same circuitry as adder circuitry 336.

Indices $i_0$ through $i_4$ of filter components $A_{i_0}(z)$ through $A_{i_4}(z)$ may be different integers selected from 0 through 4, such that a different one of the D=5 subbands of the downsampled data of filtering path 405 through 409 is processed in the corresponding filter component. For example, in the illustrated 2/5 resampling filter 400, index $i_0$ of the first filter component $A_{i_0}(z)$ may be set to 3, such that filter component $A_{i_0}(z)$ processes a selected one, $i_0=3$, of the D=5 subbands of the downsampled data of filtering path 405. Index $i_1$ of the second filter component $A_{i_1}(z)$ may be set to 4, such that filter component $A_{i_1}(z)$ processes a selected one, $i_1=4$, of the D=5 subbands of the downsampled data of filtering path 406, that is different from the subband processed by the first filter component $A_{i_0}(z)$. Indices $j_0$ through $j_4$ may be set similarly to indices $i_0$ through $i_4$. By appropriately choosing the value of indices $i_0$ through $i_4$ and $j_0$ through $j_4$, pairings of filter components sharing the same filtering path may be controlled. For example, in the illustrated 2/5 resampling filter 400, $i_0$ may be set to 3 and $j_0$ may be set to 0, which causes $A_3(z)$ and $B_0(z)$ to share the same filtering path 405.

The LVDS receiver 404 functions similarly to commutator circuitries 306 and 308 from FIG. 3, clocking in input data having input sample rate $f_s$ and received at input 402 at a rate of one sample per unit time. A new data sample is thus delivered to filtering paths 405 through 409, successively, e.g., one at each time clock cycle. The rate at which data is output to filtering paths 405 through 409 may be controlled by LVDS control signal 403. Therefore, new data arrives at each filtering path 405 through 409 at a rate of $f_s/D$. As illustrated in FIG. 4, filter components corresponding to different polyphase decompositions of different subfilters $H_0(z)$ and $H_1(z)$ may process the same common input, and thus share the same filtering path. For example, $A_{i_0}(z)$ and $B_{j_0}(z)$ may share the same filtering path, 405, $A_{i_1}(z)$ and $B_{j_1}(z)$ may share the same filtering path, 406, and so on.

Filter 400 may be configured to accommodate additional delays or advances, for example, as illustrated in FIG. 2C where an advance of 2 time cycles is introduced to guarantee causality. In filter 400, this two-cycle advance may be translated into shifted pairings of filter components sharing the same filtering path, i.e., pairings (A0, B2), (A1, B3), (A2, B4), (A3, B0), and (A4, B1). This corresponds to setting indices of filter components appropriately, e.g., setting $i_0$ to 3 and $j_0$ to 0.

Adder circuitry 430 sums the outputs of filter components $A_{i_0}(z)$ through $A_{i_4}(z)$ at rate $f_s/D$, whereas adder circuitry 432 sums the outputs of filter components $B_{j_0}(z)$ through $B_{j_4}(z)$ at rate $f_s/D$. Finally, multiplexer 440 selectively outputs, at an output sample rate $(U/D)f_s$ controlled by control input 442, one of the outputs of adder circuitries 430 and 432. Multiplexer 440 thus generates output data $Y(z)$ at the output sample rate of $(U/D)f_s$.

The structure shown in FIG. 4 may be optimized in a number of ways. Depending on factors such as the device clock rate, number of input channels supported by the device, and desired decimation and interpolation factor (U,D), some or all filtering paths may be folded in TDM fashion to achieve maximum resource sharing, as shown below in FIG. 5. For example, if the clock rate of the device may be set higher than $f_s/D$, additional simplification of the filter structure through time division multiplexing (e.g., sharing hardware resources along filtering paths) may be implemented. In one example, the input data may arrive at 402 at rate $f_s=500$ MHz, and the downsampled data at each of filter components 410-414 and 420-424 is thus $f_s/D$, or 100 MHz. If the device clock rate, e.g., the FPGA clock rate, can be set to 200 MHz, one can combine two filter components $A_i(z)$ and $B_j(z)$ to share hardware resources such as multiplier, adder, and memory circuitry in a time division multiplexing fashion, along a single filtering path. As a result, only D=5 parallel filtering paths are needed in this filter, each path having a sample rate of 100 MHz but operating and outputting data at the FPGA clock rate of 200 MHz. This in turn results in reducing the multiplier count by half and limiting the number of filtering paths to D. In addition, no multiplexer 440 would be needed to combine the outputs of the different subfilters.

Figure 5:
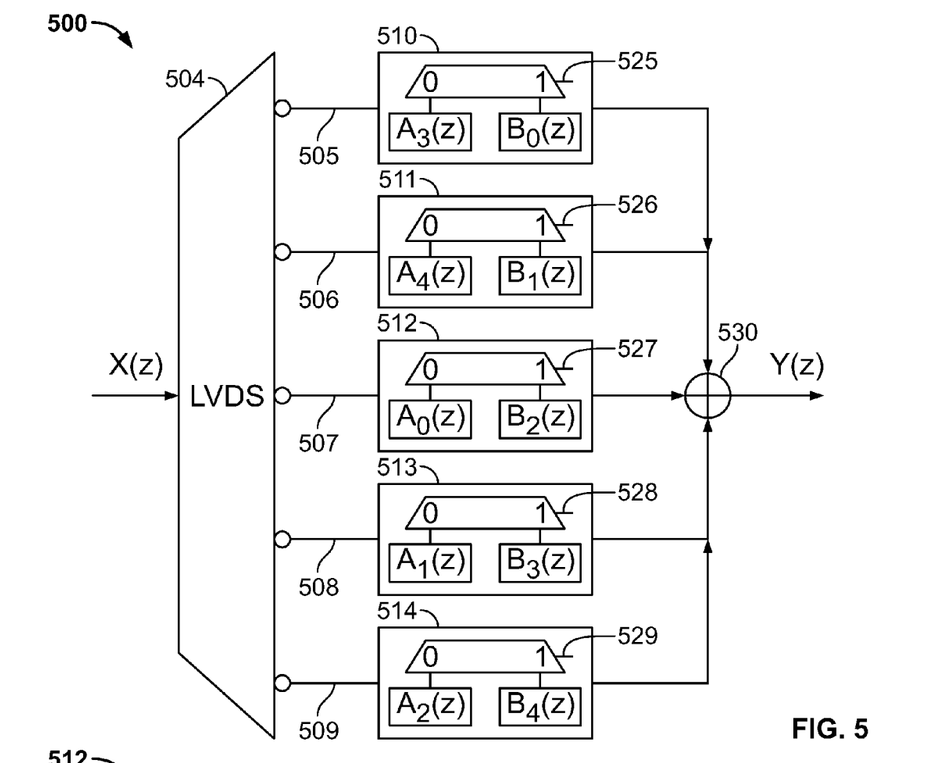
FIG. 5 is a block diagram of a third embodiment of a resampling filter in accordance with one embodiment of the present invention.

These various optimizations are illustrated in filter 500 of FIG. 5. Filter 500 first downsamples input signal $X(z)$ using LVDS receiver circuitry 504 to generate downsampled data along D=5 filtering paths 505-509. The rate at each one of the filtering paths 505-509 is $f_s/D$. Setting the device clock rate to a multiple U of $f_s/D$, U filter components may be combined to form a filtering cluster and share resources along a single filtering data path. In the example illustrated in FIG. 5, the device clock rate is set to $(U/D)f_s$, thereby allowing to combine two filter components $A_i(z)$ and $B_j(z)$ into one filtering cluster. For instance, filter components $A_3(z)$ and $B_0(z)$ are combined into filtering cluster 510, filter components $A_4(z)$ and $B_1(z)$ are combined into filtering cluster 511, and so on. As a result, only D=5 parallel filtering paths are needed, each path having sample rate $f_s/D$ but operating and outputting data at $(U/D)f_s$, the device clock rate.

In each filtering cluster 510-514, sharing multipliers may involve the use of a multiplexer to select which filter component coefficient to use. This selection may be controlled by control inputs 525-529, respectively. For example, in filtering cluster 510, control input 525 may control the switching between coefficients corresponding to filter component $A_3(z)$ and coefficients corresponding to filter component $B_0(z)$. The switching occurs at rate $(U/D)f_s$, e.g., at each clock cycle. Therefore, even though data is fed at $f_s/D$ to filtering cluster 510, data is output at rate $(U/D)f_s$ because of the time division multiplexing in filtering cluster 510.

It should be noted that switching between filter coefficients in filtering clusters 510-514 does not require the use of selection circuitry. For example, instead of a multiplexer, a dual memory bank can be used to store coefficients corresponding to the two filter components, and a single bit bank selector may be used to determine which coefficient to use at each clock cycle.

Finally, adder circuitry 530 combines the outputs of filtering clusters 510-514, having each a rate of $(U/D)f_s$. Adder circuitry 530 thus generates final output signal $Y(z)$ at rate of $(U/D)f_s$.

Because of the timing adjustment introduced in FIG. 2C to ensure causality, some filtering clusters, e.g., clusters 510 and 511, may require additional delays compared to clusters 512, 513, or 514. This will be illustrated in connections with FIGS. 6 and 7 below.

Figure 6:
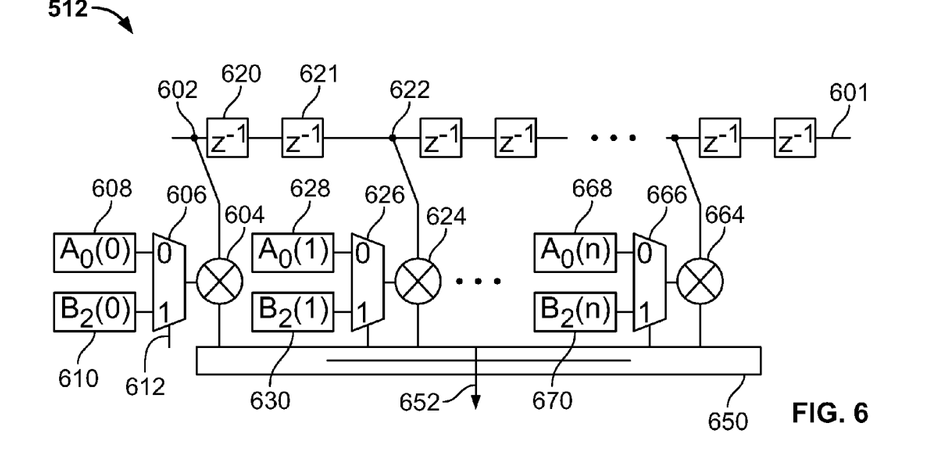
FIG. 6 illustrates one implementation of a filtering cluster of FIG. 5 in accordance with one embodiment of the present invention.

FIG. 6 illustrates an exemplary tap-based finite impulse response (FIR) filter implementation of filtering clusters 512 of FIG. 5 in accordance with an aspect of the present invention. Similar implementation may be used for filtering clusters 513 and 514. FIG. 6 includes tap delay line 601, multiplier circuits 604, 624, and 664, selection circuitries 606, 626, and 666, filter component coefficients 608, 610, 628, 630, 668, and 670, and adder tree circuitry 650. Filter components 608, 610, 628, 630, 668, and 670 may be implemented using registers, look-up tables, or any other suitable implementation.

A FIR filter calculates a weighted sum of a finite number of inputs, summing a number of multiplication results, where each multiplication is between a sample and a coefficient. Each such multiplication may be referred to as a tap. Mathematically, a FIR filter may be described as:

$$Y_k = \sum_{i=1}^{n} c_i \cdot s_{k-i} \quad \text{(EQ. 2)}$$

where $Y_k$ is the $k^{th}$ output term, $c_i$ is the $i^{th}$ coefficient, $s_{k-i}$ is the $(k-i)^{th}$ sample, and n is the number of taps in the filter. For example, an n-tap implementation of filter component $A_0(z)$ may be implemented using a bank of n filtering coefficients $A_0(1), A_0(2), \ldots, A_0(n)$. Similarly, an n-tap implementation of filter component $B_2(z)$ may be implemented using a bank of n filtering coefficients $B_2(1), B_2(2), \ldots, B_2(n)$.

As illustrated in FIG. 6, the input signal is fed to tap delay line 601 that includes multiple taps represented by dots, e.g., taps 602 and 622, separated by a number of delay elements, e.g., delay elements 620 and 621. The number of delay elements between consecutive taps may be controlled to achieve the desired resource sharing in each filtering cluster. For example, the delay between consecutive taps may correspond to the ratio of the device clock rate, over the rate at which the data is input at 602. In this example, the device clock rate may be set to 200 MHz, wherein the downsampled data fed to each filtering path is 100 MHz. This corresponds to U=2 one-cycle delay elements between consecutive taps, as illustrated in FIG. 6.

Downsampled data, e.g., from filtering path 507 of FIG. 5, is fed through tap 602 to a first multiplier circuit 604. Selection circuitry 606 selectively outputs to multiplier circuit 604 one of filtering coefficient $A_0(0)$ associated with filter component $A_0(z)$ and filtering coefficient $B_2(0)$ associated with filter component $B_2(z)$. Control input 612 of selection circuitry 606 is used to control which filtering coefficient is fed to multiplier circuitry 602, and may be updated every cycle. For example, $A_0(0)$ may be selected as an output the first (and every odd) cycle and $B_2(0)$ may be selected as an output the second (and every even cycle). Similarly, each tap i=1, . . . , n is coupled to an associated selection circuitry that selectively outputs coefficient $A_0(i)$ or $B_2(i)$ based on the clock cycle.

The output of multiplier circuit 604 is fed to adder tree circuitry 650, which collects data from all multiplier circuits of filter component 512. The data output at 652 corresponds to the output of filtering cluster 512, and is at rate $(U/D)f_s$.

Figure 7:
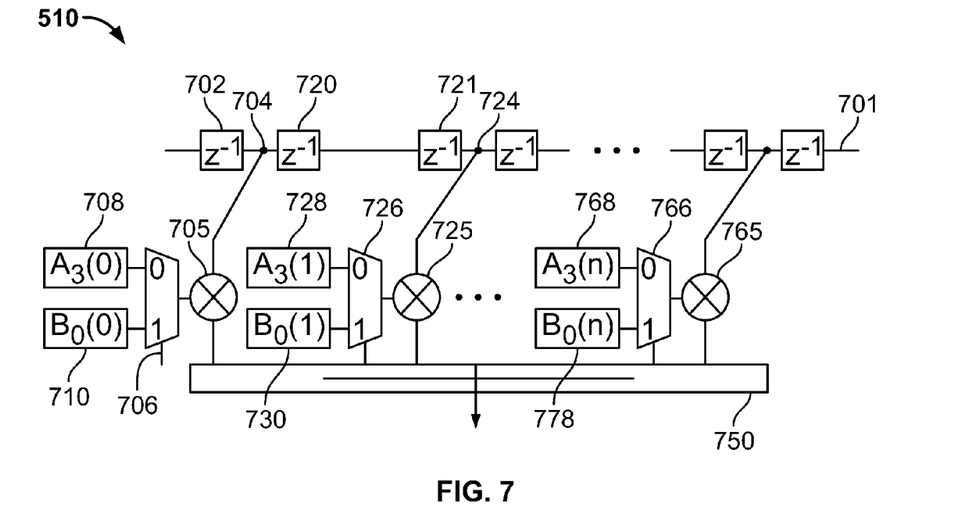
FIG. 7 illustrates one implementation of another filtering cluster of FIG. 5 in accordance with one embodiment of the present invention.

FIG. 7 illustrates an exemplary implementation of filtering clusters 510. Similar implementation may be used for filtering cluster 511. FIG. 7 includes tap delay line 701, multiplier circuits 705, 725, and 765, selection circuitries 706, 726, and 766, filter component coefficients 708, 710, 728, 730, 768, and 770, and adder tree circuitry 750. Filter components 708, 710, 728, 730, 768, and 770 may be implemented similarly to filter components 608, 610, 628, 630, 668, and 670 from FIG. 6.

FIG. 7 is similar to FIG. 6, except that the location of the taps (e.g., taps 704 and 724) on tap delay line 701 is shifted to the right by 1 cycle. This delay may be due to timing adjustments to ensure causality, e.g., as explained in FIG. 2C above, and may be accomplished by feeding input data to the first tap 704 through an appropriately number of delay elements, e.g., delay element 702 in this example.

As can be seen from FIGS. 4-7 above, timing adjustments may be achieved by appropriately adjusting the pairings of filter components in each of the filtering clusters as well as by shifting taps on the tap delay line in some of the filtering clusters, e.g., clusters 510 and 511. Such adjustments allow a more efficient reuse of resources.

Figure 8:
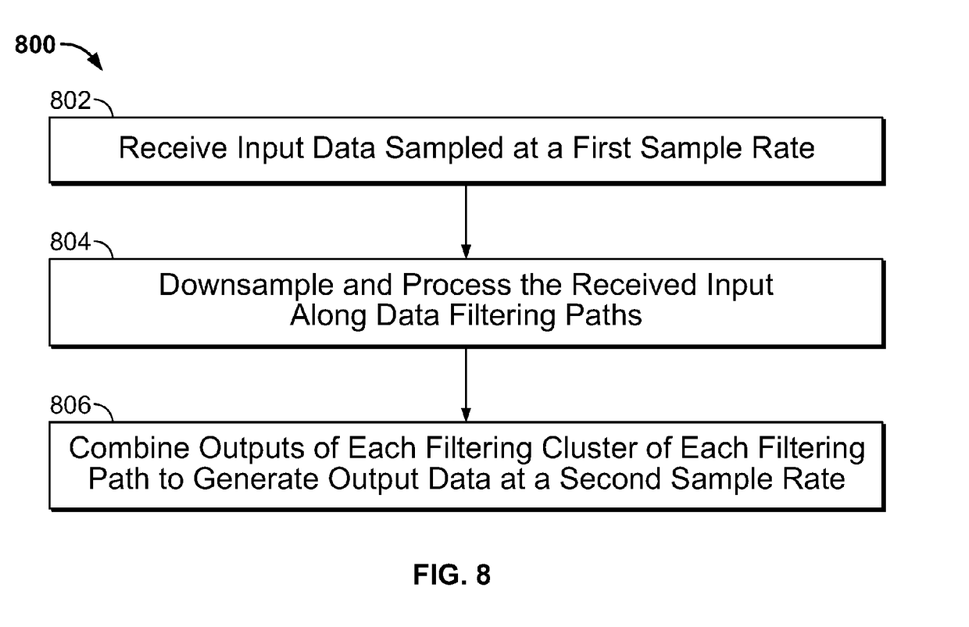
FIG. 8 shows an exemplary flowchart of a process for resampling data in accordance with one embodiment of the present invention.

FIG. 8 shows an exemplary flowchart of process 800 for resampling data in accordance with one embodiment of the present invention. Process 800 includes 802, 804, and 806.

At 802, input data is received at an input sample rate $f_s$. For example, input data may be received at 500 MHz using receiver circuitry such as commutator circuitry 306 of FIG. 3 or LVDS receiver 404 of FIG. 4.

At 804, the data received at 802 is downsampled along a number of filtering paths. The downsampling may be performing using commutator circuitry, e.g., commutator circuitry 306 of FIG. 3, or LVDS circuitry, such as LVDS receiver 404 of FIG. 4 or LVDS receiver 504 of FIG. 5. A first portion of the downsampled data is output to a first filtering path that includes a first cluster of filter components (e.g., filtering path 405 of FIG. 4 that includes a cluster of filter components $A_{i_0}(z)$ and $B_{j_0}(z)$, or filtering path 505 of FIG. 5 that includes cluster 510). A first portion of the first cluster is configured to receive and process, during a first cycle, a first portion of the downsampled data (e.g., filter component $A_{i_0}(z)$ of FIG. 4 or $A_3(z)$ of cluster 510 of FIG. 5). Similarly, a second portion of the downsampled data is output to a second filtering path that includes a second cluster of filter components (e.g., filter component $B_{j_0}(z)$ of FIG. 4 or $B_0(z)$ of cluster 510 of FIG. 5).

At 806, outputs of the filtering paths are combined to generate output data at an output sample rate. For example, this step may involve upsampling the outputs of each cluster of the first and second filtering paths following the downsampling. In some embodiments, 806 may be implemented using upsampler blocks and adder circuitry, e.g., upsampler blocks 330 and 332 and adder circuitry 336 of FIG. 3. In some embodiments, 806 may be implemented by summing outputs of first portions of each filtering cluster, e.g., of filter components $A_{i_0}(z)$ through $A_{i_4}(z)$ corresponding to subfilter $H_0(z)$ to generate a first output, and summing outputs of second portions of each filtering cluster, e.g., of filter components $B_{j_0}(z)$ through $B_{j_4}(z)$ corresponding to subfilter $H_1(z)$ to generate a second output, and then selectively outputting, using selection circuitry, one of the first and second outputs at the second sample rate, as described in FIG. 4. In some embodiments, this step may be implemented by summing outputs of multiplier circuits in each filtering cluster, e.g., without the need for selection circuitry, as described in FIGS. 5, 6, and 7.

The structures described above allow for significant reuse of resources. The extent to which resources could be reused depends on a number of factors, including the device clock rate, number of supported input channels, and the desired decimation and interpolation factor (U,D). In the embodiments illustrated in FIGS. 5, 6, and 7 above, the output rate is U times the data sample rate in each filtering. This allows to reduce by U-fold the number of multipliers $L_{total}$ of the filter, and thus reduce the length of the implemented filter $L_{total}=L/U$, where L is the number of multipliers in a filter that does not use the disclosed time division multiplexing approach. Each one of the D filtering paths has a multiplier engine of size $L_{path}=L_{total}/D$. Only one adder, e.g., adder circuitry 530 of FIG. 5, is needed, and the number of delay taps can be calculated as the output rate/(filtering path rate*$L_{total}$). If the output rate is higher (i.e., the FPGA allows for faster processing), more resources such as multiplier, adder, and memory circuitry may be time-shared, thereby reducing the total resource usage.

The above examples illustrate the case where U=2 and D=5. One of ordinary skill in the art would appreciate that similar techniques may be generalized to other resampling factors as well. The approaches disclosed above may for example be used with any (U,D) combination where U and D are co-prime, which is commonly the case in resampling filters. The disclosed approach may also apply to arbitrary (U, D) values and output rates by using different levels of hardware resource reuse.

The structures discussed above may support both single channel and multiple channels inputs. Depending on the device clock rate, resource reuse can be applied both across multiple channels, and/or across multiple filter components $A_i(z)$ and $B_j(z)$.

One advantage of the structures discussed above is that they can be configured as a conventional decimation or interpolation filter by setting either U or D to 1. This would require no modification to the hardware. Another advantage of the structures discussed above is that they allow easy run time reconfiguration of the resampling rate without requiring any hardware change. For example, one may configure the system to not perform any upsampling (i.e., U=1) or to perform upsampling by a configurable ration (U>1) simply by adjusting the control inputs of filtering clusters, e.g., by setting the control inputs 525-529 of filtering clusters 510-514 in the example of FIG. 5 to a '0' or a '1'. In some embodiments, one may switch between different values of the upsampling factor U. This may require changing the depth of the tap delay line and the number of coefficient banks in memory.

The embodiments shown above are merely exemplary. These and other configurations in accordance with embodiments of the present invention can be implemented in programmable integrated circuit devices such as programmable logic devices, where programming software can be generated to allow users to configure a programmable device to perform the various multiplications and other operations. Although the filters illustrated in FIGS. 1-8 use polyphase decomposition to decompose prototype filter response function H(z) and subfilters $H_0(z)$ and $H_1(z)$, one of ordinary skill in the art would appreciate that similar techniques may be used to decompose filters into subfilter components. Furthermore, although FIGS. 6 and 7 show tap-based FIR implementations, one of ordinary skill in the art would appreciate that other approaches may be used to implement filtering functions.

The structures described above also may be generated in fixed logic, in which case the sizes of the various computational components may be fixed to a particular application. Alternatively, the fixed logic circuitry could allow for limited parameterization.

Instructions for carrying out a method according to embodiments of the present invention for programming a programmable device to perform sample rate conversion may be encoded on a machine-readable medium, to be executed by a suitable computer or similar device to implement the method of embodiments of the present invention for programming or configuring programmable logic devices (PLDs) or other programmable devices. For example, a personal computer may be equipped with an interface to which a PLD can be connected, and the personal computer can be used by a user to program the PLD using a suitable software tool, such as the QUARTUS® II software available from Altera Corporation, of San Jose, Calif.

Figure 9A:
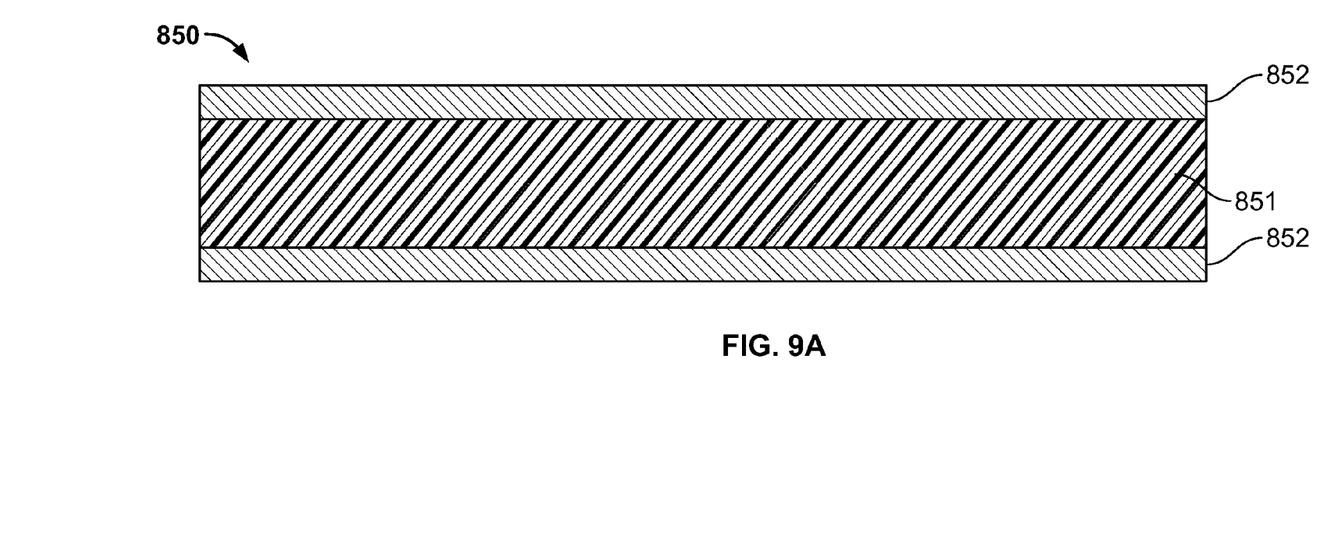
FIG. 9A is a cross-sectional view of a magnetic data storage medium encoded with a set of machine-executable instructions for performing the method according to embodiments of the present invention.

FIG. 9A presents a cross section of a magnetic data storage medium 850 which can be encoded with a machine executable program that can be carried out by systems such as the aforementioned personal computer, or other computer or similar device. Medium 850 can be a floppy diskette or hard disk, or magnetic tape, having a suitable substrate 851, which may be conventional, and a suitable coating 852, which may be conventional, on one or both sides, containing magnetic domains (not visible) whose polarity or orientation can be altered magnetically. Except in the case where it is magnetic tape, medium 850 may also have an opening (not shown) for receiving the spindle of a disk drive or other data storage device.

The magnetic domains of coating 852 of medium 850 are polarized or oriented so as to encode, in manner which may be conventional, a machine-executable program, for execution by a programming system such as a personal computer or other computer or similar system, having a socket or peripheral attachment into which the PLD to be programmed may be inserted, to configure appropriate portions of the PLD, including its specialized processing blocks, if any, in accordance with embodiments of the present invention.

Figure 9B:
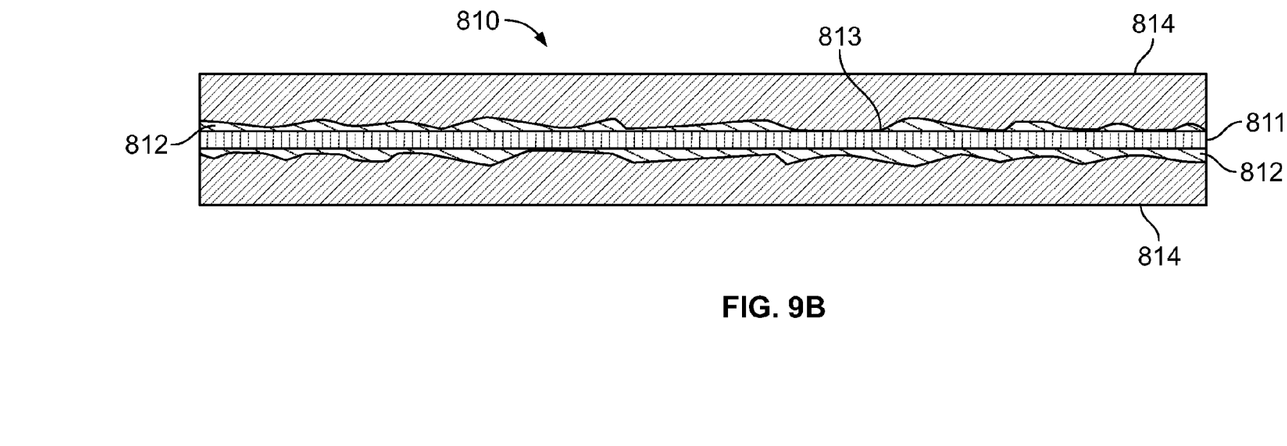
FIG. 9B is a cross-sectional view of an optically readable data storage medium encoded with a set of machine executable instructions for performing the method according to embodiments of the present invention.

FIG. 9B shows a cross section of an optically-readable data storage medium 810 which also can be encoded with such a machine-executable program, which can be carried out by systems such as the aforementioned personal computer, or other computer or similar device. Medium 810 can be a conventional compact disk read-only memory (CD-ROM) or digital video disk read-only memory (DVD-ROM) or a rewriteable medium such as a CD-R, CD-RW, DVD-R, DVD-RW, DVD+R, DVD+RW, or DVD-RAM or a magneto-optical disk which is optically readable and magneto-optically rewriteable. Medium 810 preferably has a suitable substrate 811, which may be conventional, and a suitable coating 812, which may be conventional, usually on one or both sides of substrate 811.

In the case of a CD-based or DVD-based medium, as is well known, coating 812 is reflective and is impressed with a plurality of pits 813, arranged on one or more layers, to encode the machine-executable program. The arrangement of pits is read by reflecting laser light off the surface of coating 812. A protective coating 814, which preferably is substantially transparent, is provided on top of coating 812.

In the case of magneto-optical disk, as is well known, coating 812 has no pits 813, but has a plurality of magnetic domains whose polarity or orientation can be changed magnetically when heated above a certain temperature, as by a laser (not shown). The orientation of the domains can be read by measuring the polarization of laser light reflected from coating 812. The arrangement of the domains encodes the program as described above.

A PLD 90 programmed according to embodiments of the present invention may be used in many kinds of electronic devices. One possible use is in a data processing system 900 shown in FIG. 10. Data processing system 900 may include one or more of the following components: a processor 901; memory 902; I/O circuitry 903; and peripheral devices 904. These components are coupled together by a system bus 905 and are populated on a circuit board 906 which is contained in an end-user system 907.

Figure 10:
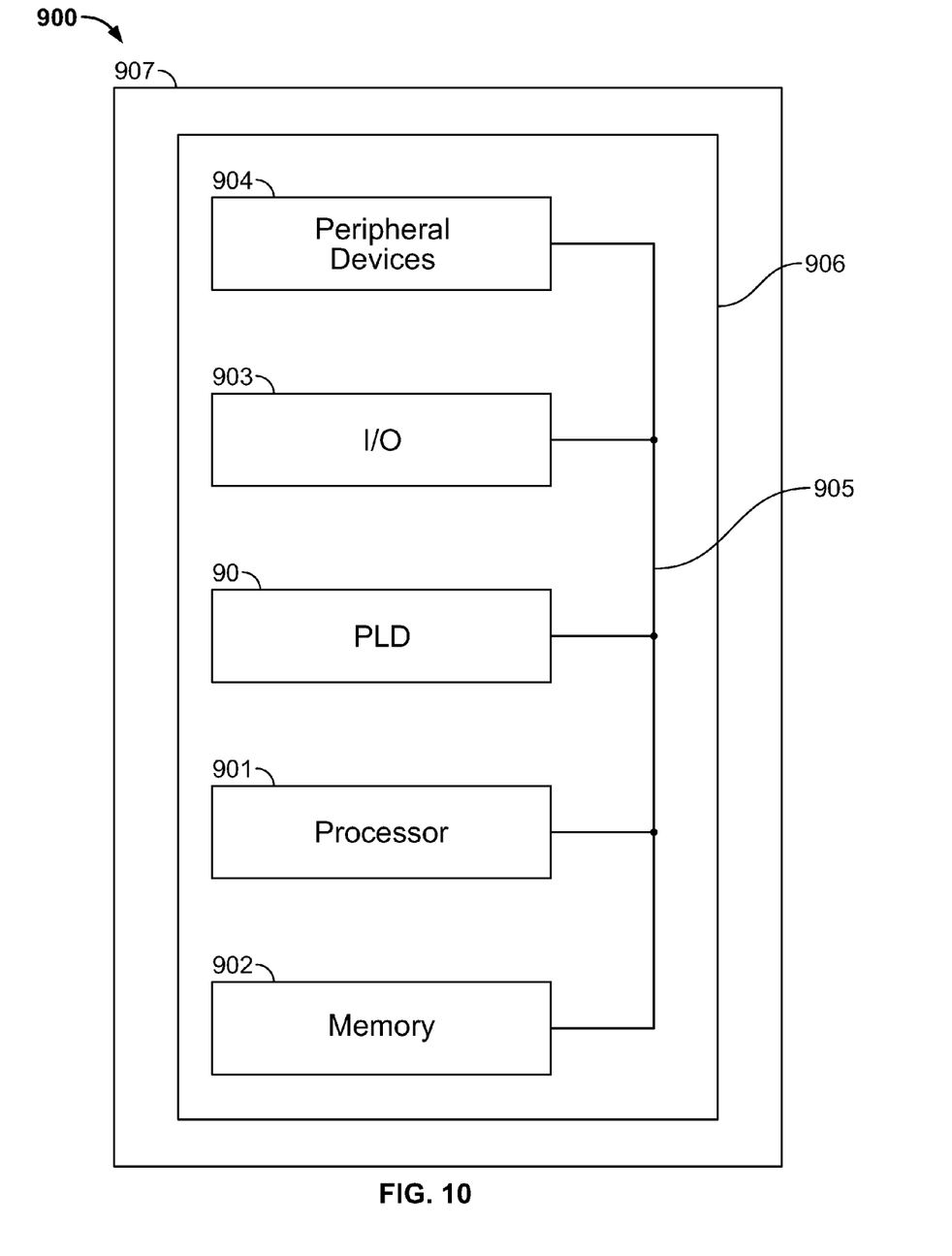
FIG. 10 is a simplified block diagram of an illustrative system employing a programmable logic device incorporating the embodiments of the present invention.

System 900 can be used in a wide variety of applications, such as computer networking, data networking, instrumentation, video processing, digital signal processing, or any other application where the advantage of using programmable or reprogrammable logic is desirable. PLD 90 can be used to perform a variety of different logic functions. For example, PLD 90 can be configured as a processor or controller that works in cooperation with processor 901. PLD 90 may also be used as an arbiter for arbitrating access to a shared resources in system 900. In yet another example, PLD 90 can be configured as an interface between processor 901 and one of the other components in system 900. It should be noted that system 900 is only exemplary, and that the true scope and spirit of the invention should be indicated by the following claims.

Various technologies can be used to implement PLDs 90 as described above and incorporating the embodiments of the present invention.

It will be understood that the foregoing is only illustrative of the principles of the invention, and that various modifications can be made by those skilled in the art without departing from the scope and spirit of the invention. For example, the various elements of this invention can be generated on a PLD in any desired number and/or arrangement. One skilled in the art will appreciate that the present invention can be practiced by other than the described embodiments, which are presented for purposes of illustration and not of limitation, and the present invention is limited only by the claims that follow.

What is claimed is:

1. A method for resampling data, the method comprising:
   downsampling, using commutator circuitry, input data received at a first sample rate to generate downsampled data and to output first and second portions of the downsampled data to first and second filtering paths respectively, wherein:

each filtering path includes a cluster of filter components;

a first portion of each cluster is operable to receive and process, during a first cycle, one of the first and second portions of the downsampled data; and a second portion of each cluster is operable to receive and process, during a second cycle, the portion of the downsampled data received by the first portion of the cluster; and combining outputs of each cluster of the first and second filtering paths to generate output data at a second sample rate.

2. The method of claim 1, wherein:

the first portion of each cluster of the first and second filtering paths respectively processes a first subband of the first and second portions of the downsampled data; and the second portion of each cluster of the first and second filtering paths respectively processes a second subband of the first and second portions of the downsampled data.

3. The method of claim 1, wherein the combining comprises upsampling the outputs of each cluster of the first and second filtering paths following the downsampling.

4. The method of claim 3, wherein the combining comprises:

summing outputs of the first portion of each cluster of the first and second filtering paths to generate a first output;

summing outputs of the second portion of each cluster of the first and second filtering paths to generate a second output; and selectively outputting, using selection circuitry, one of the first and second outputs at the second sample rate.

5. The method of claim 1, wherein the first and second portions of each cluster are operable to share resources, wherein the first portion of each cluster uses the resources during the first cycle, and wherein the second portion of each cluster uses the resources during the second cycle.

6. The method of claim 5, wherein the shared resources comprise a plurality of multiplier circuits and a selection circuitry associated with each multiplier circuit.

7. The method of claim 6, wherein the downsampling comprises selectively outputting to each multiplier circuit, using the selection circuitry associated with the corresponding multiplier circuit, one of a first and second filtering coefficients associated respectively with one of the first and second portions of each cluster, wherein:

the first filtering coefficient is selected during the first cycle; and the second filtering coefficient is selected during the second cycle.

8. The method of claim 7, wherein the downsampling comprises:

delaying one of the first and second portion of downsampled data to generate a delayed portion; and outputting the delayed portion of downsampled data into one of the multiplier circuits for multiplying with one of the first and second filtering coefficients.

9. The method of claim 6, wherein the combining comprises summing outputs of the multiplier circuits.

10. The method of claim 1, wherein the commutator circuitry comprises a low-voltage differential signaling (LVDS) receiver implemented on a field-programmable gate array (FPGA).

11. An integrated circuit for resampling data comprising:

receiver circuitry operable to downsample input data received at a first sample rate to generate downsampled data and to output first and second portions of the downsampled data to first and second filtering paths respectively, wherein:

each filtering path includes a cluster of filter components;

a first portion of each cluster is operable to receive and process, during a first cycle, one of the first and second portions of the downsampled data; and a second portion of each cluster is operable to receive and process, during a second cycle, the portion of the downsampled data received by the first portion of the cluster; and circuitry operable to combine outputs of each cluster of the first and second filtering paths to generate output data at a second sample rate.

12. The integrated circuit of claim 11, wherein:

the first portion of each cluster of the first and second filtering paths respectively processes a first subband of the first and second portions of the downsampled data; and the second portion of each cluster of the first and second filtering paths respectively processes a second subband of the first and second portions of the downsampled data.

13. The integrated circuit of claim 11, wherein the circuitry operable to combine outputs of each cluster upsamples the outputs of each cluster of the first and second filtering paths following the downsampling.

14. The integrated circuit of claim 13, wherein the circuitry operable to combine outputs of each cluster comprises:

first adder circuitry operable to sum outputs of the first portion of each cluster of the first and second filtering paths to generate a first output;

second adder circuitry operable to sum outputs of the second portion of each cluster of the first and second filtering paths to generate a second output; and selection circuitry operable to selectively output one of the first and second outputs at the second sample rate.

15. The integrated circuit of claim 11, wherein the first and second portions of each cluster are operable to share resources, wherein the first portion of each cluster uses the resources during the first cycle, and wherein the second portion of each cluster uses the resources during the second cycle.

16. The integrated circuit of claim 15, wherein the shared resources comprise a plurality of multiplier circuits and a selection circuitry associated with each multiplier circuit.

17. The integrated circuit of claim 16, wherein each cluster comprises selection circuitry associated with a corresponding multiplier circuit and operable to selectively output to the corresponding multiplier circuit one of a first and second filtering coefficients associated respectively with one of the first and second portions of the cluster, wherein:

the first filtering coefficient is selected during the first cycle; and the second filtering coefficient is selected during the second cycle.

18. The integrated circuit of claim 17, wherein the cluster comprises delay circuitry operable to:

delay one of the first and second portion of downsampled data to generate a delayed portion; and output the delayed portion of downsampled data into one of the multiplier circuits for multiplying with one of the first and second filtering coefficients.

19. The integrated circuit of claim 16, wherein the circuitry operable to combine outputs of each cluster comprises adder circuitry for summing outputs of the multiplier circuits.

20. The integrated circuit of claim 11, wherein the receiver circuitry comprises a low-voltage differential signaling (LVDS) receiver implemented on a field-programmable gate array (FPGA).

21. A fractional rate resampling filter comprising:
commutator circuitry having an input for downsampling data received at an input sample rate and outputting a plurality of D portions of downsampled data to a plurality of D filtering paths, wherein:
each filtering path includes a cluster of filter components with a plurality of U portions, and wherein each one of the U portions is operable to receive and process, during a respective cycle, one portion of the plurality of D portions of the downsampled data, and wherein outputs of each cluster of the plurality of D filtering paths are combined to generate output data at a fraction U/D of the input sample rate.

22. The fractional rate resampling filter of claim 21, wherein the plurality of U portions of each cluster is operable to share a plurality of multiplier circuits and a selection circuitry associated with each multiplier circuit.

23. The fractional rate resampling filter of claim 22, wherein one cluster comprises delay circuitry operable to:
delay one of the plurality of D portions of downsampled data to generate a delayed portion; and
output the delayed portion of downsampled data into one of the plurality of multiplier circuits for multiplying with one of one of U filtering coefficients associated respectively with one of the plurality of U portions of each cluster.

24. The fractional rate resampling filter of claim 21, wherein the commutator circuitry comprises a low-voltage differential signaling (LVDS) receiver implemented on a field-programmable gate array (FPGA).

* * * * *